(12) United States Patent
Ito et al.

(10) Patent No.: US 9,412,910 B2
(45) Date of Patent: Aug. 9, 2016

(54) SEMICONDUCTOR LIGHT EMITTING DEVICE AND METHOD FOR MANUFACTURING SAME

(75) Inventors: Toshihide Ito, Tokyo (JP); Taisuke Sato, Kanagawa-ken (JP); Toshiyuki Oka, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1188 days.

(21) Appl. No.: 13/030,453

(22) Filed: Feb. 18, 2011

(65) Prior Publication Data

US 2012/0032214 A1 Feb. 9, 2012

(30) Foreign Application Priority Data

Aug. 6, 2010 (JP) ................................. 2010-177403

(51) Int. Cl.
*H01L 33/42* (2010.01)
*H01L 33/44* (2010.01)

(52) U.S. Cl.
CPC ............... *H01L 33/44* (2013.01); *H01L 33/42* (2013.01); *H01L 2933/0016* (2013.01)

(58) Field of Classification Search
CPC .. H01L 33/42; H01L 33/44; H01L 2933/0016
See application file for complete search history.

(56) References Cited

U.S. PATENT DOCUMENTS

2012/0032214 A1* 2/2012 Ito et al. .................... 257/98

FOREIGN PATENT DOCUMENTS

| JP | 2005-123489 A | | 5/2005 | |
|---|---|---|---|---|
| JP | 2005123489 A | * | 5/2005 | ............... H01L 33/00 |
| JP | 2005-217331 | | 8/2005 | |
| JP | 2005-244129 A | | 9/2005 | |
| JP | 2006-49351 A | | 2/2006 | |
| JP | 2007-220972 | | 8/2007 | |
| JP | 2007-287786 A | | 11/2007 | |
| JP | 2009-193975 A | | 8/2009 | |
| JP | 2010-153565 A | | 7/2010 | |

OTHER PUBLICATIONS

Machine English Translation of JP 2005-123489; Kususe.*
English Abstract of JP 2005-123489; Kususe.*
U.S. Appl. No. 13/218,728, filed Aug. 26, 2011, Ito, et al.
(Continued)

*Primary Examiner* — Hrayr A Sayadian
(74) *Attorney, Agent, or Firm* — Oblon, McClelland, Maier & Neustadt, L.L.P.

(57) ABSTRACT

According to one embodiment, a semiconductor light emitting device includes a first semiconductor layer of a first conductivity type, a second semiconductor layer of a second conductivity type, a light emitting portion, a first transparent conductive layer, and a second transparent conductive layer. The light emitting portion is provided between the first and second semiconductor layers. The second semiconductor layer is disposed between the first transparent conductive layer and the light emitting portion. The first transparent conductive layer includes oxygen. The second transparent conductive layer is provided between the second semiconductor layer and the first transparent conductive layer. The second transparent conductive layer has a refractive index higher than a refractive index of the first transparent conductive layer, and includes oxygen at a concentration higher than a concentration of oxygen included in the first transparent conductive layer.

5 Claims, 6 Drawing Sheets

(56) References Cited

OTHER PUBLICATIONS

U.S. Appl. No. 13/030,264, filed Feb. 18, 2011, Ito, et al.
U.S. Appl. No. 13/165,837, filed Jun. 22, 2011, Muramoto, et al.
Japanese Office Action Issued Jun. 20, 2012 in Patent Application No. 2010-177403 (with English translation).

Jong Kyu Kim, et al., "Light-Extraction Enhancement of GaInN Light-Emitting Diodes by Graded-Refractive-Index Indium Tin Oxide Anti-Reflection Contact", Advanced Materials, 20, 2008, pp. 801-804.

* cited by examiner

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2010-177403, filed on Aug. 6, 2010; the entire contents of which are incorporated herein by reference.

FIELD

Embodiments described herein relate generally to a semiconductor light emitting device and a method for manufacturing the same.

BACKGROUND

A configuration exists for a semiconductor light emitting device such as a blue light or violet light emitting diode using a GaN semiconductor in which luminescent light is extracted via a transparent conductive film such as indium tin oxide (ITO) or the like. In order to improve light extraction efficiency it is important to reduce reflectivity at top and bottom interfaces of the transparent conductive film. There are demands for the realization of excellent electrical characteristics such as ohmic contact and high light extraction efficiency.

DETAILED DESCRIPTION

Figure 1A:
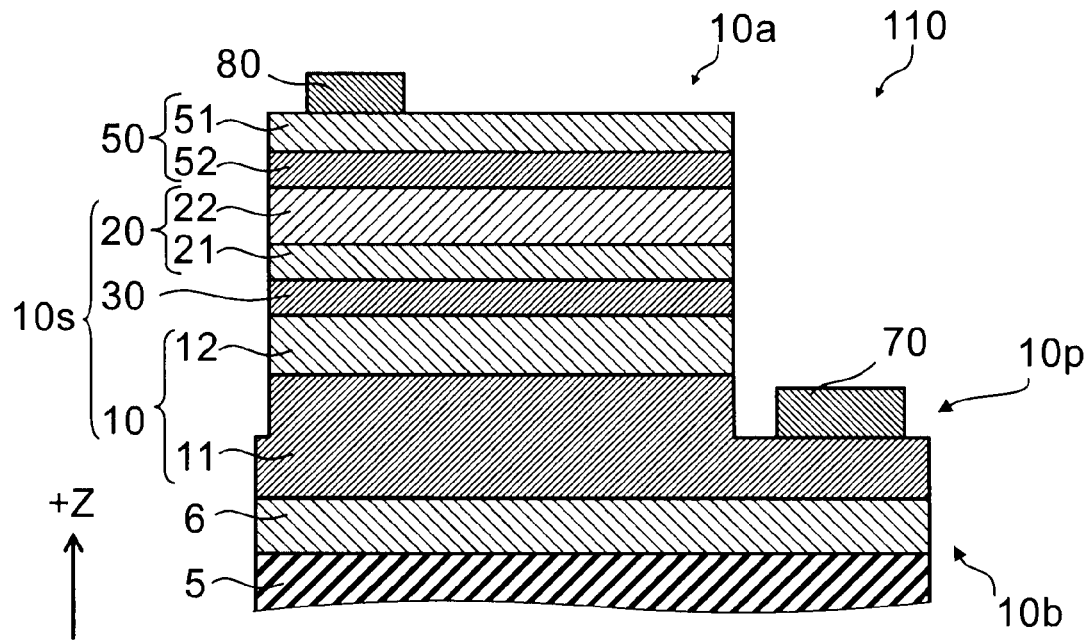
FIG. 1A and FIG. 1B are schematic cross-sectional views illustrating configurations of a semiconductor light emitting device according to an embodiment.

In general, according to one embodiment, a semiconductor light emitting device includes a first semiconductor layer of a first conductivity type, a second semiconductor layer of a second conductivity type, a light emitting portion, a first transparent conductive layer, and a second transparent conductive layer. The light emitting portion is provided between the first semiconductor layer and the second semiconductor layer. The second semiconductor layer is disposed between the first transparent conductive layer and the light emitting portion. The first transparent conductive layer includes oxygen and is transparent with respect to luminescent light emitted from the light emitting portion. The second transparent conductive layer is provided between the second semiconductor layer and the first transparent conductive layer. The second transparent conductive layer is transparent with respect to the luminescent light and has a refractive index with respect to the luminescent light higher than a refractive index of the first transparent conductive layer with respect to the luminescent light. The second transparent conductive layer includes oxygen at a concentration higher than a concentration of oxygen included in the first transparent conductive layer.

Various embodiments will be described hereinafter with reference to the accompanying drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to elements that have already appeared in the drawings and been described, and repetitious detailed descriptions of such elements are omitted.

Embodiment

Figure 1B:
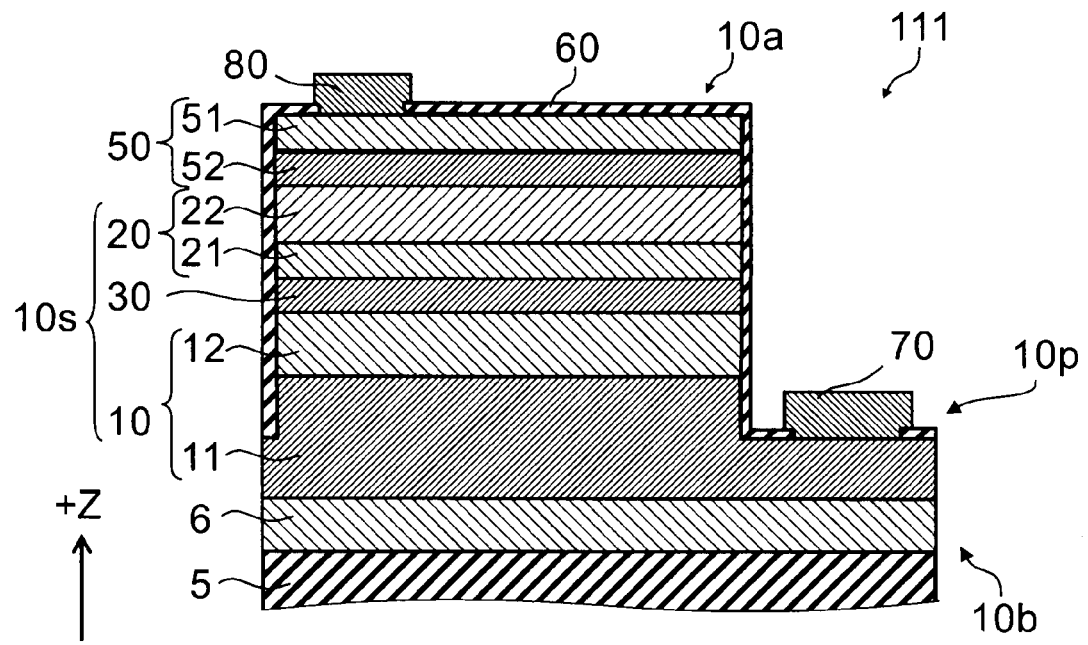

FIG. 1A and FIG. 1B are schematic cross-sectional views illustrating configurations of a semiconductor light emitting device according to the embodiment.

As illustrated in FIG. 1A, a semiconductor light emitting device 110 according to the embodiment includes a first semiconductor layer 10 of a first conductivity type, a second semiconductor layer 20 of a second conductivity type, a light emitting portion 30, a first transparent conductive layer 51, and a second transparent conductive layer 52.

The light emitting portion 30 is provided between the first semiconductor layer 10 and the second semiconductor layer 20.

The first transparent conductive layer 51 is provided on a side of the second semiconductor layer 20 opposite to the light emitting portion 30. The second semiconductor layer 20 is disposed between the light emitting portion 30 and the first transparent conductive layer 51. The first transparent conductive layer 51 is transparent with respect to luminescent light emitted from the light emitting portion 30. The first transparent conductive layer 51 includes oxygen.

The second transparent conductive layer 52 is provided between the second semiconductor layer 20 and the first transparent conductive layer 51. The second transparent conductive layer 52 is transparent with respect to the luminescent light. The second transparent conductive layer 52 has a refractive index with respect to the luminescent light higher than a refractive index of the first transparent conductive layer 51 with respect to the luminescent light. The second transparent conductive layer 52 includes oxygen at a concentration higher than a concentration of oxygen included in the first transparent conductive layer 51.

A density of oxygen vacancies in the second transparent conductive layer 52 is lower than a density of oxygen vacancies in the first transparent conductive layer 51.

In this example, the second transparent conductive layer 52 is in contact with the first transparent conductive layer 51. The first transparent conductive layer 51 and the second transparent conductive layer 52 are included in a transparent electrode 50.

The light emitting portion 30 emits at least any of, for example, UV, violet, blue, and green light. Specifically, a wavelength (dominant wavelength) of the luminescent light emitted from the light emitting portion 30 is not less than 360 nanometers (nm) and not more than 580 nm.

For example, the first conductivity type is an n-type and the second conductivity type is a p-type. However, the embodiment is not limited thereto, and the first conductivity type may be the p-type and the second conductivity type may be the n-type. Hereafter, a case in which the first conductivity type is the n-type, and the second conductivity type is the p-type will be described.

Here, a direction from the first semiconductor layer 10 toward the second semiconductor layer 20 is defined as a Z-axis direction.

The first semiconductor layer 10, the second semiconductor layer 20, and the light emitting portion 30 include, for example, nitride semiconductors.

As illustrated in FIG. 1A, the semiconductor light emitting device 110 further includes a substrate 5 provided on a side of the first semiconductor layer 10 opposite to the light emitting portion 30, and a buffer layer 6 provided between the substrate 5 and the first semiconductor layer 10. A substrate formed from sapphire, for example, is used for the substrate 5. A major surface of the substrate 5 is a (0001) plane, or, in other words, a c-plane. The major surface of the substrate 5 may be inclined with respect to the (0001) plane at an angle of, for example, 5° or smaller. An $Al_{x0}Ga_{1-x0}N$ ($0 \leq x0 \leq 1$) layer may, for example, be used for the buffer layer 6.

The first semiconductor layer 10 includes a first n-side layer 11 and a second n-side layer 12. The second n-side layer 12 is provided between the first n-side layer 11 and the light emitting portion 30. The first n-side layer 11 functions as an n-type contact layer. The second n-side layer 12 functions as an n-type guide layer. A GaN layer or the like, doped with, for example, n-type impurities (i.e. silicon or the like) at a high concentration is used for the first n-side layer 11. A GaN layer or the like, doped with, for example, n-type impurities at a lower concentration than the first n-side layer 11 is used for the second n-side layer 12.

The second semiconductor layer 20 includes a first p-side layer 21 and a second p-side layer 22. The first p-side layer 21 is provided between the second p-side layer 22 and the light emitting portion 30. The first p-side layer 21 functions, for example, as an electron overflow preventing layer (suppression layer). The second p-side layer 22 functions as a p-type contact layer. An AlGaN layer or the like, doped with, for example, p-type impurities (i.e. magnesium) is used for the first p-side layer 21. A GaN layer or the like, doped with p-type impurities at a high concentration is used for the second p-side layer 22.

The semiconductor light emitting device 110 further includes a first electrode 70 electrically connected to the first semiconductor layer 10 (specifically, the first n-side layer 11, which is an n-type contact layer) and a second electrode 80 electrically connected to the second semiconductor layer 20 (specifically the second p-side layer 22, which is a p-type contact layer). The second electrode 80 is provided on the transparent electrode 50 (specifically, the first transparent conductive layer 51) that is provided on the second semiconductor layer 20 (specifically, the second p-side layer 22, which is the p-type contact layer).

A stacked film of, for example, a Ti film, a Pt film, and an Au film is used for the first electrode 70. A stacked film of, for example, a Ni film and an Au film is used for the second electrode 80.

By applying a voltage between the first electrode 70 and the second electrode 80, a current is provided to the light emitting portion 30 via the first semiconductor layer 10, the second semiconductor layer 20, and the transparent electrode 50, and light (luminescent light) is emitted from the light emitting portion 30.

A stacked structural body 10s includes the first semiconductor layer 10, the second semiconductor layer 20, and the light emitting portion 30. In this example, a portion of the first semiconductor layer 10, and portions of the light emitting portion 30 and the second semiconductor layer 20 are removed from a first major surface 10a that is on a second semiconductor layer 20 side of the stacked structural body 10s, and the first semiconductor layer 10 is exposed on the first major surface 10a side. The first electrode 70 is provided in contact with the exposed first semiconductor layer 10 and the second electrode 80 is provided in contact with the transparent electrode 50, which is in contact with the second semiconductor layer 20. The substrate 5 and the buffer layer 6 are provided on a second major surface 10b, which is a side of the stacked structural body 10s opposite to the first major surface 10a.

As illustrated in FIG. 1B, another semiconductor light emitting device 111 according to the embodiment further includes an insulating layer 60 provided on a side of the first transparent conductive layer 51 opposite to the second transparent conductive layer 52. The first transparent conductive layer 51 is disposed between the second transparent conductive layer 52 and the insulating layer 60. The insulating layer 60 is transparent with respect to the luminescent light. A silicon oxide film, for example, is used for the insulating layer 60. The embodiment is not limited thereto, and any insulating material being transparent with respect to the luminescent light emitted from the light emitting portion 30 can be used for the insulating layer 60.

The insulating layer 60 is provided except in a portion where the first transparent conductive layer 51 is in contact with the second electrode 80. Thereby, electrical continuity between the first transparent conductive layer 51 and the second electrode 80 is ensured. The insulating layer 60 covers, for example, side faces of the first transparent conductive layer 51, the second transparent conductive layer 52, the second semiconductor layer 20, and the light emitting portion 30. Furthermore, the insulating layer 60 is provided on a side face of the first semiconductor layer 10 and on a face of the first major surface 10a side of the first semiconductor layer 10. The insulating layer 60 functions as a passivation film of the stacked structural body 10s. The insulating layer 60 is provided with a portion removed where the first semiconductor layer 10 is in contact with the first electrode 70. Thereby, electrical continuity between the first semiconductor layer 10 and the first electrode 70 is ensured.

The insulating layer 60 may be provided or omitted as necessary.

The light emitting portion 30 has a single quantum well (SQW) structure or a multi quantum well (MQW) structure.

Figure 2A:
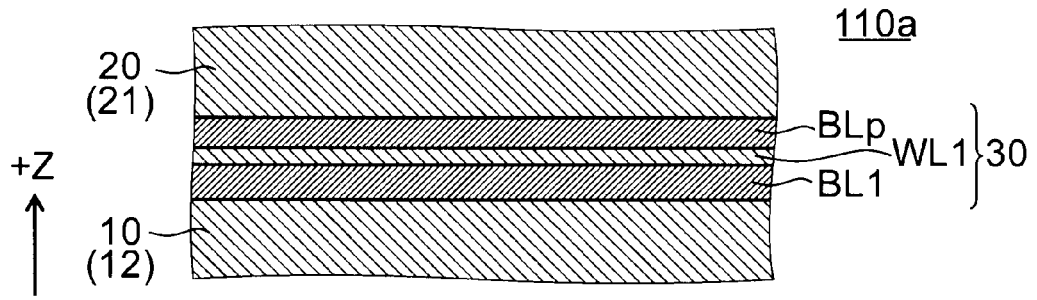
FIG. 2A to FIG. 2C are schematic cross-sectional views illustrating configurations of portions of the semiconductor light emitting device according to the embodiment.
Figure 2B:
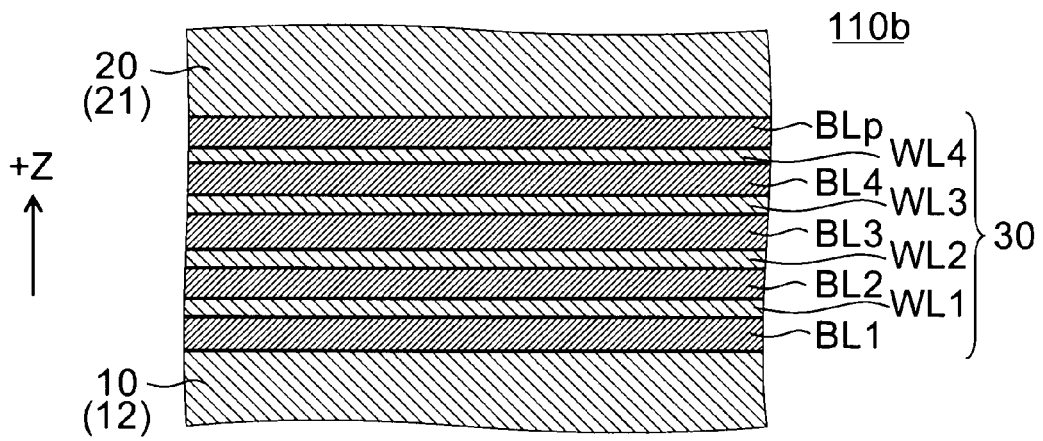
Figure 2C:
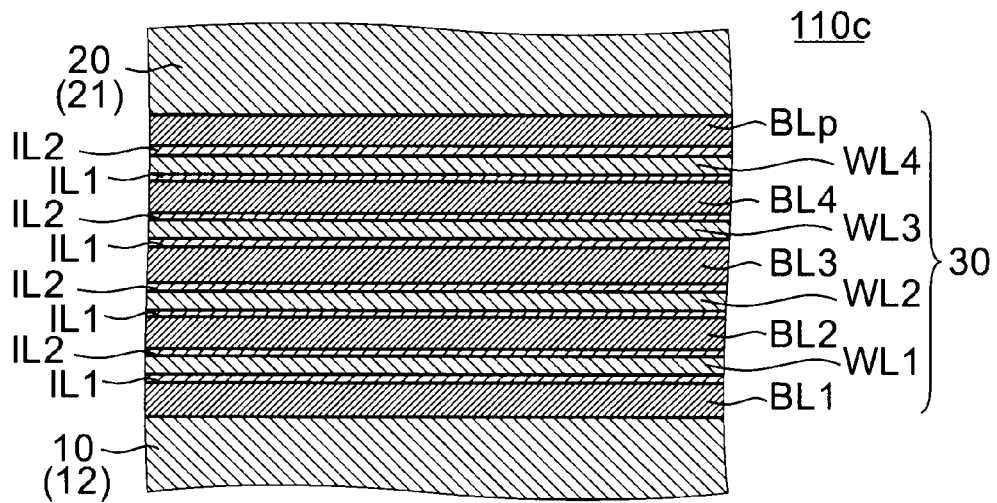

FIG. 2A to FIG. 2C are schematic cross-sectional views illustrating configurations of portions of the semiconductor light emitting device according to the embodiment.

Specifically, these figures are schematic drawings illustrating examples of configurations of the light emitting portion 30.

As illustrated in FIG. 2A, in a semiconductor light emitting device 110a according to the embodiment, the light emitting portion 30 has a SQW structure. Specifically, the light emitting portion 30 includes a first barrier layer BL1, a p-side barrier layer BLp, and a first well layer WL1 provided between the first barrier layer BL1 and the p-side barrier layer BLp.

In this specification, the term "stacked" includes cases where constituents are stacked directly and also cases where constituents are stacked by inserting other layers therebetween. Specifically, as described hereinafter, another layer may be provided between the first barrier layer BL1 and the first well layer WL1 and between the first well layer WL1 and the p-side barrier layer BLp.

As illustrated in FIG. 2B, in a semiconductor light emitting device 110b according to the embodiment, the light emitting portion 30 has a MQW structure. Specifically, the light emitting portion 30 includes a plurality of barrier layers stacked in the Z-axis direction (first to fourth barrier layers BL1 to BL4 and p-side barrier layer BLp) and well layers (first to fourth well layers WL1 to WL4) provided between each of the plurality of barrier layers. In this example, four layers of the well layers are provided, but the number of well layers can be any number.

Thus, the light emitting portion 30 further includes an Nth barrier layer provided on a side of an (N−1)th well layer WL opposite to an (N−1)th barrier layer (wherein N is an integer greater than or equal to 2), and an Nth well layer provided on a side of the Nth barrier layer opposite to an (N−1)th well layer.

As illustrated in FIG. 2C, in a semiconductor light emitting device 110c according to the embodiment, the light emitting portion 30 further includes intermediate layers provided between each of the barrier layers and the well layers. Specifically, the light emitting portion 30 includes a first intermediate layer IL1 provided between the (N−1)th barrier layer and the (N−1)th well layer, and a second intermediate layer IL2 provided between the (N−1)th well layer and the Nth barrier layer. Furthermore, the second intermediate layer IL2 is provided between the Nth well layer and the p-side barrier layer BLp. The first intermediate layer IL1 and the second intermediate layer IL2 can be provided or omitted as necessary. Additionally, the first intermediate layer IL1 may be provided and the second intermediate layer IL2 may be omitted. Additionally, the second intermediate layer IL2 may be provided and the first intermediate layer IL1 may be omitted.

$In_{x1}Al_{y1}Ga_{1-x1-y1}N$ ($0 \leq x1 < 1$, $0 \leq y1 < 1$, $x1+y1 \leq 1$) can, for example, be used for the barrier layers (i.e. the first to fourth barrier layers BL1 to BL4 and the Nth barrier layer). Additionally, $In_{0.02}Al_{0.33}Ga_{0.65}N$ can, for example, be used for the barrier layers. A thickness of the barrier layers can, for example, be 12.5 nm.

$In_{x2}Al_{y2}Ga_{1-x2-y2}N$ ($0 \leq x2 < 1$, $0 \leq y2 < 1$, $x2+y2 \leq 1$) can, for example, be used for the p-side barrier layer BLp. Additionally, $In_{0.02}Al_{0.33}Ga_{0.65}N$ can, for example, be used for the p-side barrier layer BLp. A thickness of the barrier layers can, for example, be 12.5 nm.

$In_{x3}Al_{y3}Ga_{1-x3-y3}N$ ($0 < x3 \leq 1$, $0 \leq y3 < 1$, $x3+y \leq 1$) can, for example, be used for the well layers (i.e. the first to fourth well layers WL1 to WL4 and the Nth well layer). Additionally, $In_{0.15}Ga_{0.85}N$ can, for example, be used for the well layers. A thickness of the well layers can, for example, be 2.5 nm.

A composition ratio of In (proportion of number of atoms of In among group III elements) included in the well layers is higher than a composition ratio of In (proportion of number of atoms of In among group III elements) included in the barrier layers (the first to fourth barrier layers BL1 to BL4, the Nth barrier layer, and the p-side barrier layer BLp). Thus, a band gap energy in the barrier layers can be made larger than a band gap energy in the well layers.

$In_{x4}Ga_{1-x4}N$ ($0 \leq x4 < 1$) can, for example, be used for the first intermediate layer IL1. Additionally, $In_{0.02}Ga_{0.98}N$ can, for example, be used for the first intermediate layer IL1. A thickness of the first intermediate layer IL1 can, for example, be 0.5 nm.

$In_{x5}Ga_{1-x5}N$ ($0 \leq x5 < 1$) can, for example, be used for the second intermediate layer IL2. Additionally, $In_{0.02}Ga_{0.98}N$ can, for example, be used for the second intermediate layer IL2. A thickness of the second intermediate layer IL2 can, for example, be 0.5 nm.

The composition ratio of In (proportion of number of atoms of In among group III elements) included in the well layers is high than a composition ratio of In (proportion of number of atoms of In among group III elements) included in the first intermediate layer IL1 and the second intermediate layer IL2. Thus, the band gap energy in the first intermediate layer IL1 and the second intermediate layer IL2 can be made larger than the band gap energy in the well layers.

The first intermediate layer IL1 can also be considered to be a portion of the barrier layers. Additionally, the second intermediate layer IL2 can also be considered to be a portion of the barrier layers. The well layers and stacked barrier layers may include a plurality of layers having different compositions.

The first intermediate layer IL1 and the second intermediate layer IL2 may be provided in the SQW structure illustrated in FIG. 2A. In this case, the first intermediate layer IL1 is provided between the first barrier layer BL1 and the first well layer WL1 and the second intermediate layer IL2 is provided between the first well layer WL1 and the p-side barrier layer BLp.

The above described is an example of a configuration of the light emitting portion 30, but the embodiment is not limited thereto. Materials used for the barrier layers, the p-side barrier layer BLp, the well layers, the first intermediate layer ILL and the second intermediate layer IL2, along with the thicknesses thereof can be varied in different ways. As described above, the barrier layers, the p-side barrier layer BLp, the well layers, the first intermediate layer IL1, and the second intermediate layer IL2 include nitride semiconductors.

Hereinafter, a configuration and characteristics of the transparent electrode 50 will be described using the semiconductor light emitting device 110 as an example.

As illustrated in FIG. 1A, in the semiconductor light emitting device 110, the transparent electrode 50 provided on the second semiconductor layer 20 includes the first transparent conductive layer 51 and the second transparent conductive layer 52, which is stacked with the first transparent conductive layer 51. Another transparent conductive layer may be provided between the first transparent conductive layer 51 and the second transparent conductive layer 52. Hereinafter, a case will be described where the second transparent conductive layer 52 is in contact with the first transparent conductive layer 51.

The first transparent conductive layer 51 and the second transparent conductive layer 52 include an oxide including at least one (type of) element selected from the group consisting of In, Sn, Zn, and Ti. ITO may be used, for example, for the first transparent conductive layer 51 and the second transparent conductive layer 52. At least any of $In_2O_3$ and $SnO_2$ may be used, for example, for the first transparent conductive layer 51 and the second transparent conductive layer 52.

A refractive index of the first transparent conductive layer 51 is, for example, not less than 1.8 and less than 2.0. A refractive index of the second transparent conductive layer 52 is, for example, not less than 2.0 and not more than 2.2.

A thickness of the first transparent conductive layer 51 is, for example, not less than 50 nm and not more than 400 nm.

A thickness of the second transparent conductive layer 52 is, for example, not less than 50 nm and not more than 400 nm.

As described hereinafter, the first transparent conductive layer 51 and the second transparent conductive layer 52 can be formed by a vapor deposition method. For example, the first transparent conductive layer 51 and the second transparent conductive layer 52 are formed by a sputtering method.

The first transparent conductive layer 51 and the second transparent conductive layer 52 can have a polycrystalline state. The first transparent conductive layer 51 and the second transparent conductive layer 52 can include grains having a grain size of not less than 100 nm and not more than 500 nm. The grain size of the grains is calculated based on, for example, a transmission electron microscope image. In a plurality of grains, a size of grains with large grain sizes is not less than 100 nm and not more than 500 nm. Grains with grain sizes of less than 100 nm may also exist. In cases where the grains have an elongated shape, a length in a long direction is considered to be the grain size.

The refractive index of the second semiconductor layer 20 is 2.43 when, for example, a GaN layer is used for the second semiconductor layer 20. In other words, the refractive index of the second transparent conductive layer 52 is set to be lower than the refractive index of the second semiconductor layer 20 with respect to the luminescent light. Thereby, the luminescent light emitted from the light emitting portion 30 transmits through the second semiconductor layer 20 and can efficiently enter the second transparent conductive layer 52 and the first transparent conductive layer 51.

As described above, in the semiconductor light emitting device 110 according to the embodiment, the second transparent conductive layer 52 having a high refractive index and a high oxygen concentration is provided on a side close to the light emitting portion 30, and the first transparent conductive layer 51 having a low refractive index and a low oxygen concentration is provided on the second electrode 80 side. Thereby, loss at the second transparent conductive layer 52 and the first transparent conductive layer 51 of the luminescent light exiting from the light emitting portion 30 toward the second electrode 80 side via the second transparent conductive layer 52 and the first transparent conductive layer 51 can be suppressed. Moreover, by setting the oxygen concentration in the second transparent conductive layer to be high, a contact resistance between the second semiconductor layer 20 (i.e. a GaN layer) and the second transparent conductive layer 52 can be reduced. Thus, in the semiconductor light emitting device 110, excellent electrical characteristics and high light extraction efficiency can be simultaneously realized. Specifically, according to the embodiment, an LED that has low driving voltage and high efficiency, and that emits any of UV, violet, blue, and green light can be provided.

A configuration in which an oblique evaporation method is used to change a refractive index of a transparent electrode in a thickness direction is known (a first reference example) as an attempt to suppress the loss of light at the transparent electrode (ITO film). In the first reference example, a porous ITO film formed by an oblique evaporation method is used. By changing a deposition angle, a porosity of the ITO film changes, and the refractive index decreasing when the porosity is high, is utilized. In the first reference example, the refractive index changes based on a change in density defined by porosity. When using this method as well, the refractive index of the second semiconductor layer 20 side of the transparent electrode 50 can be made higher than the refractive index of the second electrode 80 side. Thereby, it is understood that the loss of light can be reduced. However, in the configuration of the first reference example, contact characteristics with GaN are not taken into account. Specifically, a density of the ITO film formed by the oblique evaporation method is low, and contact resistance with GaN is high. Furthermore, because the ITO film is porous, light scattering at a grain boundary is great, which leads to an insufficient improvement in light extraction efficiency. Furthermore, because the porous ITO film has a high sheet resistance, uniformity of light emission is low.

In contrast, in the semiconductor light emitting device 110 according to the embodiment, both the refractive index and the oxygen concentration of the transparent electrode 50 are controlled. Therefore, the loss of light can be suppressed and, simultaneously, the contact resistance can be reduced. Moreover, because a porous ITO film is not used, light scattering at the grain boundary can be suppressed and light extraction efficiency can be sufficiently improved. Additionally, because a porous ITO film is not used, the sheet resistance is low, the transparent electrode 50 can fulfill the function of spreading the current, and an intensity of the emitted light can be made uniform within a face. Thereby, when applying the embodiment to a face-up type light emitting diode, superior characteristics of particularly uniform light emission can be exerted.

In the semiconductor light emitting device 110 according to the embodiment, the refractive index changes based on a change in oxygen concentration, or, in other words, the refractive index changes based on a change in density caused by a difference in oxygen vacancies. The characteristics are utilized in which a low refractive index is obtained in the first transparent conductive layer 51 with a low oxygen concentration and a high refractive index along with excellent contact characteristics with the GaN layer is obtained in the second transparent conductive layer 52 with the high oxygen concentration.

The contact resistance between the GaN layer and the transparent electrode 50 is thought to be lowest when the oxygen concentration included in the transparent electrode 50 is a predetermined value. It is thought that when the oxygen concentration is higher than the predetermined value (in a case of a high oxygen concentration region), the contact resistance will increase due to decreasing carrier density in the transparent electrode 50. On the other hand, it is thought that when the oxygen concentration is lower than the predetermined value (in a case of a low oxygen concentration region), the contact resistance will increase due to decreasing crystallinity of the transparent electrode 50.

In the semiconductor light emitting device 110 according to the embodiment, for example, by setting the oxygen concentration in the second transparent conductive layer 52 in a vicinity of the predetermined value described above, a low contact resistance with the GaN layer and a high refractive index are obtained. Moreover, by lowering the oxygen concentration in the first transparent conductive layer 51 so as to be lower than the oxygen concentration in the second transparent conductive layer 52, a low refractive index is obtained and light extraction efficiency is improved. Here, in the first transparent conductive layer 51, while crystallinity decreases and contact resistance with the GaN layer will be in a high state, this is not a problem because the first transparent conductive layer 51 is not in contact with the GaN layer.

Setting the oxygen concentration in the transparent electrode 50 to a high oxygen concentration region that is higher than the predetermined value described above is also conceivable (a second reference example). In this case, emphasizing light extraction efficiency leads to gaining a low refractive index by reducing an oxygen concentration of a portion of a side of the transparent electrode 50 that is close to the second electrode 80 and gaining a high refractive index by increasing an oxygen concentration of a portion of a side of the transparent electrode 50 that is close to the second semiconductor layer 20. However, in this configuration, the low oxygen concentration having gained the low contact resistance within the high oxygen concentration region corresponds to the portion of the side of the transparent electrode 50 that is close to the second electrode 80, and the contact resistance in the portion of the side of the transparent electrode 50 that is close to the second semiconductor layer 20 increases. Therefore, it is difficult to achieve low contact resistance and high light extraction efficiency simultaneously.

In the configuration of the second reference example, in a case attempting to obtain low contact resistance and high light extraction efficiency simultaneously, a configuration is conceivable in which, for example, a first transparent conductive film is provided island-like on the second semiconductor layer 20, and a second transparent conductive film having a refractive index and a contact resistance different from the first transparent conductive film is provided so as to be in contact with the second semiconductor layer 20 while covering the first transparent conductive film. However, in this case, the configuration becomes complicated, the contact area decreases, and reduction of the contact resistance and improvement of the light extraction efficiency are also insufficient.

In contrast, in the semiconductor light emitting device 110 according to the embodiment, by setting the oxygen concentration in the second transparent conductive layer 52 to a value at which the contact resistance decreases (i.e. a value in the vicinity of the predetermined value described above), a low contact resistance and a high refractive index are obtained; and by setting the oxygen concentration in the first transparent conductive layer 51 to be lower than the second transparent conductive layer 52, a low refractive index is obtained. Therefore, a complicated configuration such as that described above is unnecessary. Thereby, excellent electrical characteristics and high light extraction efficiency can be simultaneously realized.

In a case where the insulating layer 60 is provided such as in the semiconductor light emitting device 111 illustrated in FIG. 1B, the refractive index of the first transparent conductive layer 51 can be set higher than a refractive index of the insulating layer 60 with respect to the luminescent light. Thereby, the luminescent light travelling in the first transparent conductive layer 51 efficiently enters the insulating layer 60 and light extraction efficiency is further improved. In this example, a silicon oxide film is used as the insulating layer 60 and in this configuration the refractive index of the insulating layer 60 is, for example, 1.46.

Thus, the refractive index of the second transparent conductive layer 52 with respect to the luminescent light is set lower than the refractive index of the second semiconductor layer 20 with respect to the luminescent light; the refractive index of the first transparent conductive layer 51 with respect to the luminescent light is set lower than the refractive index of the second transparent conductive layer 52 with respect to the luminescent light; and the refractive index of the insulating layer 60 with respect to the luminescent light is set lower than the refractive index of the first transparent conductive layer 51 with respect to the luminescent light. Thereby, light extraction efficiency improves.

For example, in a configuration of an embodiment where a GaN layer is used as the second semiconductor layer 20; an ITO layer having a high oxygen concentration, a refractive index of 2.14, and a thickness of 50 nm is used as the second transparent conductive layer 52; an ITO layer having a low oxygen concentration, a refractive index of 1.97, and a thickness of 150 nm is used as the first transparent conductive layer 51; and a silicon oxide film having a refractive index of 1.46 is used as the insulating layer 60, a reflectance of a stacked film thereof is 2.9%.

On the other hand, in a third reference example where a GaN layer is used as the second semiconductor layer 20; an ITO film having a refractive index of 2.14 and a thickness of 200 nm is used as a transparent electrode having a constant refractive index; and a silicon oxide film having a refractive index of 1.46 is used as the insulating layer 60, a reflectance of a stacked film thereof is high at 6.5%. Thus, in the third reference example, light extraction efficiency is low.

In contrast, as described above, in the configuration according to the embodiment, the reflectance can be reduced to ½ of the reflectance of the third reference example and transmittance can be improved.

Measurements of the oxygen concentrations in the first transparent conductive layer 51 and the second transparent conductive layer 52 can be performed using a technique such as, for example, secondary ion mass spectrometry (SIMS) or the like. Additionally, measurements of oxygen vacancy densities can be performed by using, for example, positron annihilation spectroscopy (PAS). However, the embodiment is not limited thereto, and any technique can be used to measure the oxygen concentration and oxygen vacancy densities of the first transparent conductive layer 51 and the second transparent conductive layer 52.

Measurements of the refractive indexes of the first transparent conductive layer 51 and the second transparent conductive layer 52 can be performed using a technique such as, for example, spectroscopic ellipsometry (SE).

An example of a method for manufacturing such a first transparent conductive layer 51 and a second transparent conductive layer 52 will be described.

Figure 3A:
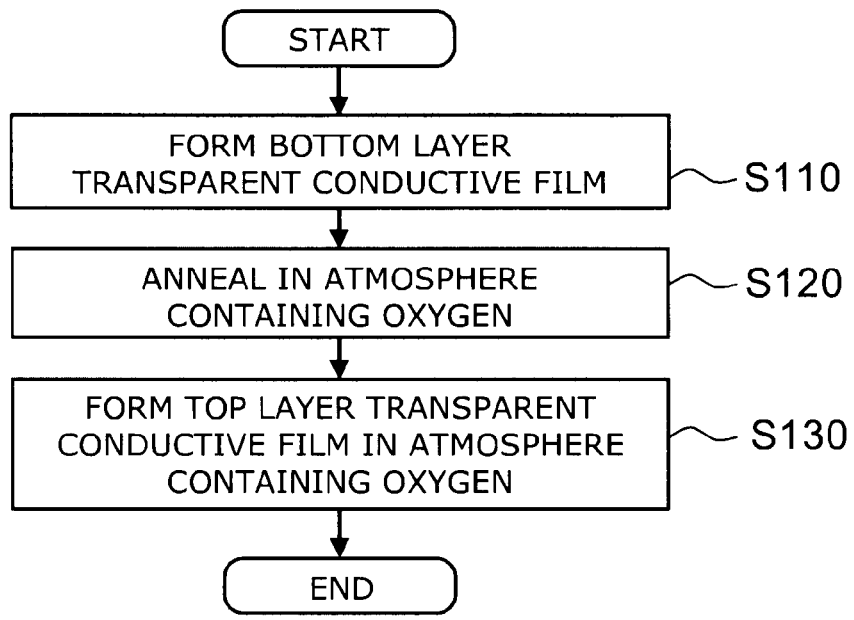
FIG. 3A and FIG. 3B are flowcharts illustrating manufacturing methods of the semiconductor light emitting device according to the embodiment.
Figure 3B:
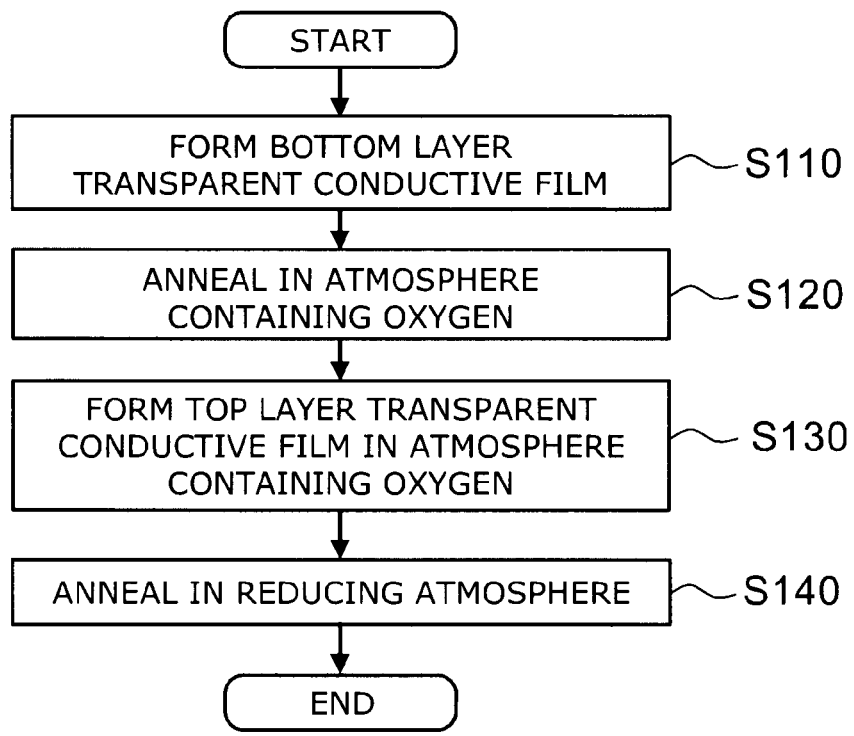

FIG. 3A and FIG. 3B are flowcharts illustrating manufacturing methods of the semiconductor light emitting device according to the embodiment.

These flowcharts illustrate examples of differing manufacturing methods.

Figure 4A:
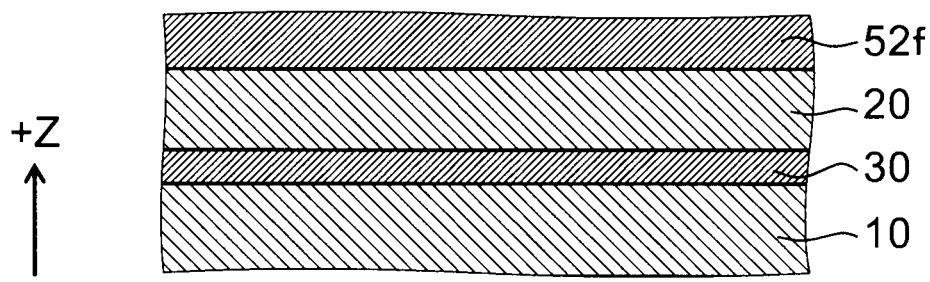
FIG. 4A and FIG. 4B are sequential schematic cross-sectional views illustrating manufacturing methods of the semiconductor light emitting device according to the embodiment.
Figure 4B:
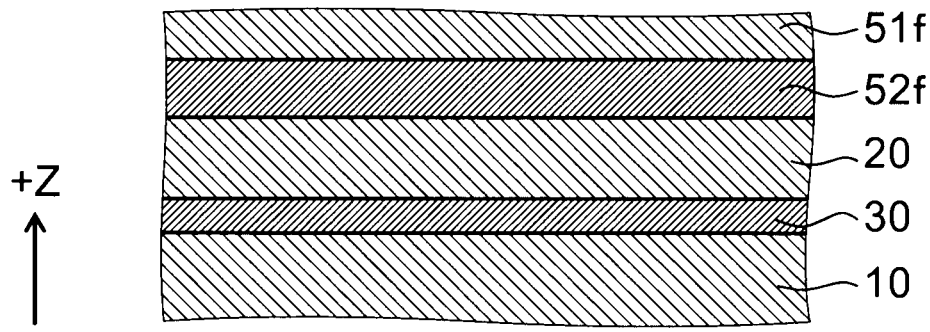

FIG. 4A and FIG. 4B are procedural schematic cross-sectional views illustrating manufacturing methods of the semiconductor light emitting device according to the embodiment.

As illustrated in FIG. 3A and FIG. 4A, in the manufacturing method for the semiconductor light emitting device according to the embodiment (i.e. the semiconductor light emitting device 110), a lower transparent conductive film 52f is formed by a vapor deposition method on a semiconductor layer (i.e. the second semiconductor layer 20) that is provided on the light emitting portion 30 (step S110). The lower transparent conductive film 52f is a film that will become the second transparent conductive layer 52.

The forming of the lower transparent conductive film 52f can include forming the lower transparent conductive film 52f by a sputtering method in an atmosphere including an inert gas (at least any of helium, neon, argon, krypton, and xenon). For example, the lower transparent conductive film 52f is formed by sputtering in an atmosphere including argon. A temperature in this sputtering is, for example, room temperature. A sputtering method in an atmosphere substantially free of oxygen is used for the forming of the lower transparent conductive film 52f.

As illustrated in FIG. 3A, the lower transparent conductive film 52f is annealed in an atmosphere including oxygen (step S120). For example, the lower transparent conductive film 52f is subjected to annealing at, for example, not less than 400° C. and not more than 800° C. in oxygen (or in air) (first sintering). A duration of the annealing is, for example, not less than 1 minute and not more than 5 minutes.

Thereby, the lower transparent conductive film 52f can be polycrystallized while having oxygen introduced thereto. Thereby, a second transparent conductive layer 52 having a high oxygen concentration, a low density of oxygen vacancies, and a high refractive index is formed.

As illustrated in FIG. 3A and FIG. 4B, an upper transparent conductive film 51f is formed on the lower transparent conductive film 52f by a vapor deposition method in an atmosphere including oxygen (step S130). The upper transparent conductive film 51f is a film that will become the first transparent conductive layer 51.

The forming of the upper transparent conductive film 51f can include forming the upper transparent conductive film 51f by a sputtering method in an atmosphere further including an inert gas (at least any of helium, neon, argon, krypton, and xenon) in addition to oxygen. For example, the upper transparent conductive film 51f is formed by sputtering in an atmosphere including argon and oxygen. A temperature in this sputtering is, for example, room temperature. An atmosphere including a higher concentration of oxygen than the oxygen included in the atmosphere used for the forming of the lower transparent conductive film 52f is used for the forming of the upper transparent conductive film 51f.

Thereby, the first transparent conductive layer 51 having a low oxygen concentration, a high density of oxygen vacancies, and a low refractive index is formed.

Furthermore, as illustrated in FIG. 3B, after the forming of the upper transparent conductive film (step S130), annealing is further performed in a reducing atmosphere (step S140). For example, the upper transparent conductive film 51f is subjected to annealing at, for example, 400° C. or higher in nitrogen (second sintering). A duration of the annealing is, for example, not less than 30 seconds and not more than 30 minutes. The embodiment is not limited thereto, and the annealing in the reducing atmosphere can include annealing in an atmosphere of at least any of nitrogen and an inert gas (at least any of helium, neon, argon, krypton, and xenon).

Thereby, the upper transparent conductive film 51f is polycrystallized. At this time, oxygen is not introduced to the upper transparent conductive film 51f. Thereby, the first transparent conductive layer 51 having a low oxygen concentration, a high density of oxygen vacancies, and a low refractive index is formed.

In step S110 described above, the lower transparent conductive film 52f is formed by sputtering in an atmosphere substantially free of oxygen, and then in step S120, annealing is performed in oxygen and oxygen is introduced to the lower transparent conductive film 52f. Therefore, a structure of the film is not negatively affected and highly concentrated oxygen can be introduced. Moreover, in step S130, the upper transparent conductive film 51f is formed by sputtering in an atmosphere including oxygen, and then in step S140, annealing is performed in a reducing atmosphere and polycrystallization is carried out while removing excess oxygen. Therefore, a first transparent conductive layer 51 having an excellent polycrystalline structure can be obtained.

A sheet resistance of the transparent electrode 50 including the first transparent conductive layer 51 and the second transparent conductive layer 52 obtained in such manners was about 5Ω/square (5Ω/□). On the other hand, a sheet resistance of the transparent electrode obtained by an oblique evaporation method as described in relation to the first reference example is about 14Ω/square. According to the embodiment, a sheet resistance that is ⅓ of the sheet resistance of the first reference example can be obtained.

In the first transparent conductive layer 51 and the second transparent conductive layer 52 obtained by the method described above, grain sizes are not less than 100 nm and not more than 500 nm. By enlarging the grains to be not less than 100 nm and not more than 500 nm, light scattering at grain boundaries is suppressed.

Specifically, using sputtering for the forming of the lower transparent conductive film 52f and the upper transparent conductive film 51f is more preferable, because the grains sizes in the first transparent conductive layer 51 and the second transparent conductive layer 52 can be increased.

In the first reference example described above, an ITO film formed through an oblique evaporation method is used, but in this case, a grain size of the ITO film is small at 50 nm or less. Therefore, light scattering at a grain boundary is great and efficiency is low.

In the embodiment, in cases where an increase in light scattering due to the grain size is substantially not a problem, the lower transparent conductive film 52f and the upper transparent conductive film 51f may be formed using an evaporation method.

Figure 5A:
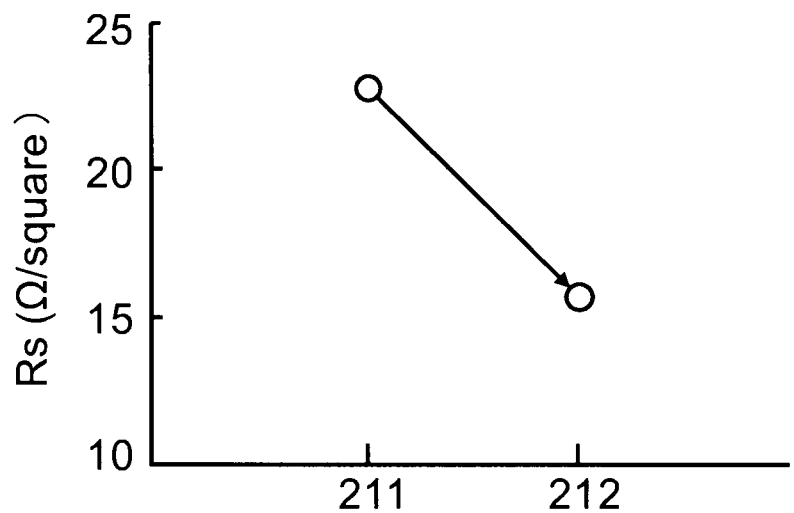
FIG. 5A and FIG. 5B are graphs illustrating characteristics related to the semiconductor light emitting devices.
Figure 5B:
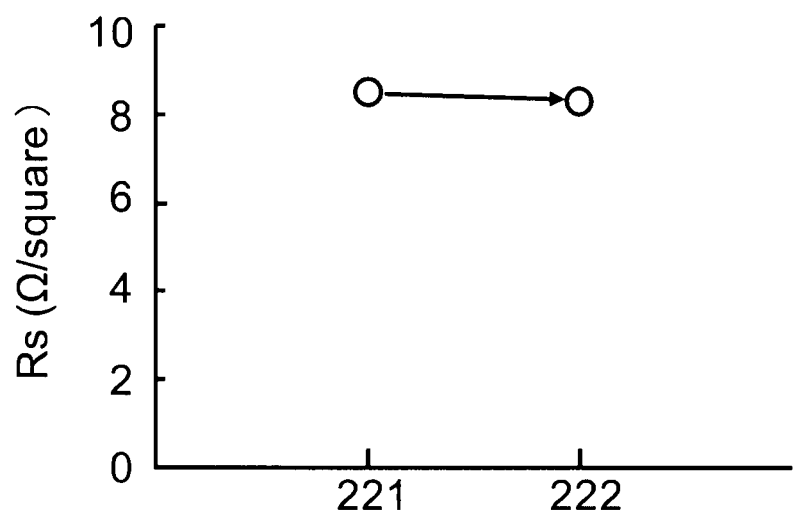

FIG. 5A and FIG. 5B are graphs illustrating characteristics related to a semiconductor light emitting devices.

Specifically, these graphs illustrate measurement results of a sheet resistance Rs of the first transparent conductive layer 51 and the second transparent conductive layer 52 when subjected to different processing.

A test material 211 illustrated in FIG. 5A is the second transparent conductive layer 52 in which the annealing in an atmosphere including oxygen (first sintering) is completed after the forming of the lower transparent conductive film 52f. A test material 212 is a test material obtained by annealing the test material 211 in nitrogen.

A test material 221 illustrated in FIG. 5B is the first transparent conductive layer 51 that is obtained by forming the upper transparent conductive film 51f and annealing in a reducing atmosphere (second sintering). A material 222 is a test material obtained after annealing the test material 211 in nitrogen.

As illustrated in FIG. 5A, the sheet resistance Rs of the test material 211 that is the second transparent conductive layer 52 following completion of the annealing in an atmosphere including oxygen (first sintering) was about 23Ω/square. In contrast, the sheet resistance Rs of the test material 212 following annealing in nitrogen thereafter decreased to about 15Ω/square. It is thought that the sheet resistance decreased as a result of the oxygen in the second transparent conductive layer 52 being desorbed due to the annealing in nitrogen and oxygen vacancies being formed.

As illustrated in FIG. 5B, the sheet resistance Rs of the test material 221 that formed the first transparent conductive layer 51 is about 8.5Ω/square. The sheet resistance of a test material 222, obtained by annealing the test material 221 in nitrogen, did not differ greatly from the test material 221 and was about 8.2 Ω/square. The first transparent conductive layer 51 with the low oxygen concentration has a low oxygen concentration and therefore has little oxygen that is prone to desorption. Therefore, it is thought that the effects of oxygen desorption are small because the amount of oxygen that is desorbed by the annealing in nitrogen is small. Thus, it is thought that when the first transparent conductive layer 51 is provided on the second transparent conductive layer 52 with the high oxygen concentration, even if subjected to annealing in nitrogen, desorption of oxygen from the second transparent conductive layer 52 can be suppressed.

Thus, by providing the high oxygen concentration second transparent conductive layer 52 on the second semiconductor layer 20 side and the low oxygen concentration first transparent conductive layer 51 on the second transparent conductive layer 52, the oxygen concentrations of the second transparent conductive layer 52 and the first transparent conductive layer 51 can be varied and stable characteristics can be obtained.

Annealing in a reducing atmosphere may further be performed after the annealing in an atmosphere including oxygen (step S120) and before the forming of the upper transparent conductive film 51f (step S130). The annealing in a reducing atmosphere can include annealing in an atmosphere of at least any of, for example, nitrogen and an inert gas (at least any of helium, neon, argon, krypton, and xenon).

Thereby, excess oxygen introduced to the lower transparent conductive film 52f is removed and the characteristics of the lower transparent conductive film 52f stabilize. In other words, a second transparent conductive layer 52 having stable characteristics can be obtained. However, relatively weak conditions are employed for the annealing at this time. Thereby, excessive desorption of oxygen from the lower transparent conductive film 52f can be suppressed.

FIG. 6A to FIG. 6L are graphs illustrating characteristics related to a semiconductor light emitting devices according to the embodiment.

Figure 6A:
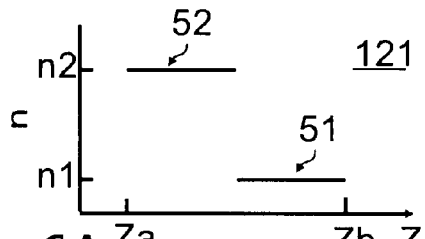
FIG. 6A to FIG. 6L are graphs illustrating characteristics related to the semiconductor light emitting devices according to the embodiment.
Figure 6D:
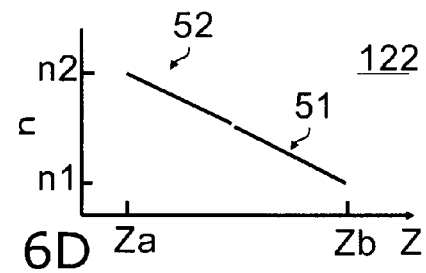
Figure 6B:
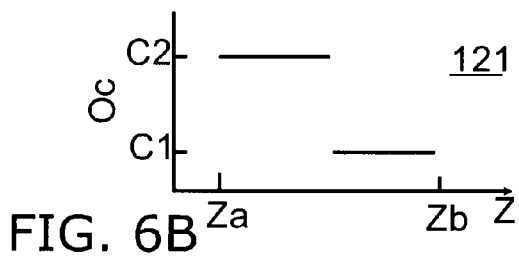
Figure 6E:
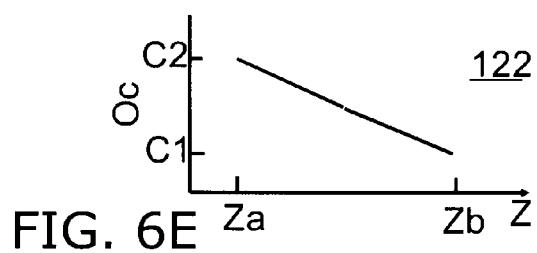
Figure 6C:
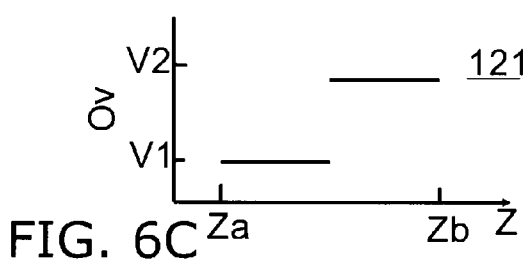
Figure 6F:
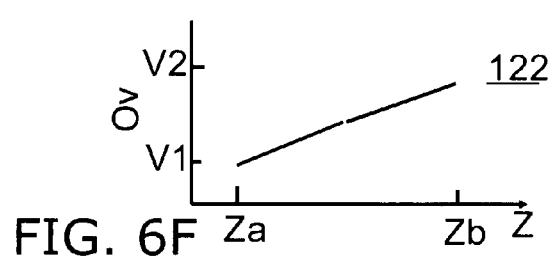
Figure 6G:
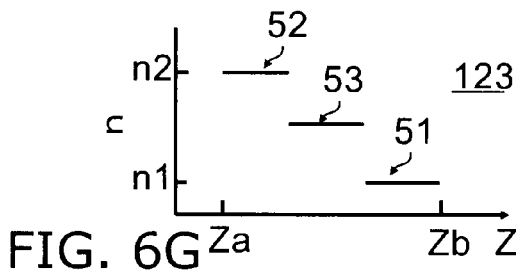
Figure 6J:
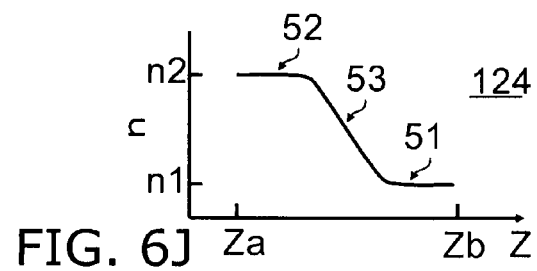
Figure 6H:
Figure 6K:
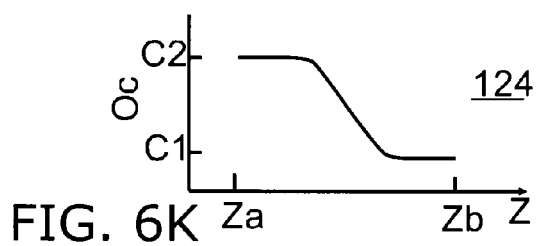
Figure 6I:
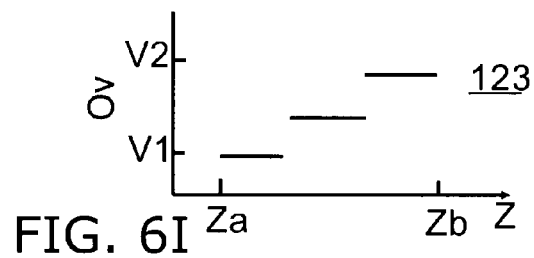
Figure 6L:
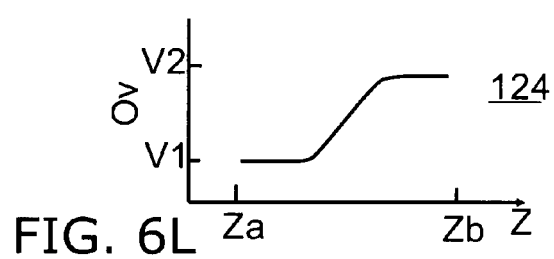

Specifically, FIG. 6A to FIG. 6C illustrate the characteristics of a semiconductor light emitting device 121; FIG. 6D to FIG. 6F illustrate the characteristics of a semiconductor light emitting device 122; FIG. 6G to FIG. 6I illustrate the characteristics of a semiconductor light emitting device 123; and FIG. 6J to FIG. 6L illustrate the characteristics of a semiconductor light emitting device 124. FIG. 6A, FIG. 6D, FIG. 6G, and FIG. 6J illustrate a refractive index n of the first transparent conductive layer 51 and the second transparent conductive layer 52. FIG. 6B, FIG. 6E, FIG. 6H, and FIG. 6K illustrate an oxygen concentration Oc in the first transparent conductive layer 51 and the second transparent conductive layer 52. FIG. 6C, FIG. 6F, FIG. 6I, and FIG. 6L illustrate an oxygen vacancy density Ov in the first transparent conductive layer 51 and the second transparent conductive layer 52. In these graphs, the horizontal axis is a position in the Z-axis direction. A position Za corresponds to an interface between the second semiconductor layer 20 and the second transparent conductive layer 52 and a position Zb corresponds to an interface between the first transparent conductive layer 51 and the second electrode 80.

As illustrated in FIG. 6A, in the semiconductor light emitting device 121, the refractive index n of the first transparent conductive layer 51 is a first refractive index n1; and the refractive index n of the second transparent conductive layer 52 is a second refractive index n2, which is higher than the first refractive index n1.

As illustrated in FIG. 6B, the oxygen concentration Oc in the first transparent conductive layer 51 is a first oxygen concentration C1; and the oxygen concentration Oc in the second transparent conductive layer 52 is a second oxygen concentration C2, which is higher than the first oxygen concentration C1.

As illustrated in FIG. 6C, the oxygen vacancy density Ov in the first transparent conductive layer 51 is a first oxygen vacancy density V1; and an oxygen vacancy density Ov in the second transparent conductive layer 52 is a second oxygen vacancy density V2, which is lower than the first oxygen vacancy density V1.

Thus, in the semiconductor light emitting device 121, the refractive index n, the oxygen concentration Oc, and the oxygen vacancy density Ov of the first transparent conductive layer 51 are substantially constant, and the refractive index n, the oxygen concentration Oc, and the oxygen vacancy density Ov of the second transparent conductive layer 52 are substantially constant.

As illustrated in FIG. 6D, in the semiconductor light emitting device 122, the refractive index n of the first transparent conductive layer 51 changes and the refractive index n of the second transparent conductive layer 52 also changes. As illustrated in FIG. 6E, the oxygen concentration Oc of the first transparent conductive layer 51 changes, and the oxygen concentration Oc of the second transparent conductive layer 52 also changes.

As illustrated in FIG. 6F, the oxygen vacancy density Ov in the first transparent conductive layer 51 changes, and the oxygen vacancy density Ov in the second transparent conductive layer 52 also changes.

Thus, in the semiconductor light emitting device 122, the refractive indexes n, the oxygen concentrations Oc, and the oxygen vacancy densities Ov of the first transparent conductive layer 51 and the second transparent conductive layer 52 change.

The refractive index n of at least either of the first transparent conductive layer 51 and the second transparent conductive layer 52 can change in the thickness direction. The oxygen concentration Oc of at least either of the first transparent conductive layer 51 and the second transparent conductive layer 52 can change in the thickness direction. The oxygen vacancy density Ov in at least either of the first transparent conductive layer 51 and the second transparent conductive layer 52 can change in the thickness direction.

As illustrated in FIG. 6G, in the semiconductor light emitting device 123, a third transparent conductive layer 53 is provided between the first transparent conductive layer 51 and the second transparent conductive layer 52. A refractive index n of the third transparent conductive layer 53 is a value between the first refractive index n1 and the second refractive index n2.

As illustrated in FIG. 6H, an oxygen concentration Oc of the third transparent conductive layer 53 is a value between the first oxygen concentration C1 and the second oxygen concentration C2.

As illustrated in FIG. 6I, an oxygen vacancy density Ov in the third transparent conductive layer 53 is a value between the first oxygen vacancy density V1 and the second oxygen vacancy density V2.

Thus, in the semiconductor light emitting device 123, the third transparent conductive layer 53 having characteristics between the first transparent conductive layer 51 and the second transparent conductive layer 52 is further provided. A plurality of transparent conductive layers may be further provided between the first transparent conductive layer 51 and the second transparent conductive layer 52. In this example, the refractive indexes n, the oxygen concentrations Oc, and the oxygen vacancy densities Ov of the first transparent conductive layer 51, the second transparent conductive layer 52, and the third transparent conductive layer 53 are substantially constant, but these values may change for each of these layers.

As illustrated in FIG. 6J, in the semiconductor light emitting device 124, the refractive indexes n of the first transparent conductive layer 51 and the second transparent conductive layer 52 are substantially constant, and the refractive index n of the third transparent conductive layer 53 changes.

As illustrated in FIG. 6K, the oxygen concentrations Oc of the first transparent conductive layer 51 and the second transparent conductive layer 52 are substantially constant, and the oxygen concentration Oc of the third transparent conductive layer 53 changes.

As illustrated in FIG. 6L, the oxygen vacancy densities Ov in the first transparent conductive layer 51 and the second transparent conductive layer 52 are substantially constant, and the oxygen vacancy density Ov of the third transparent conductive layer 53 changes.

There are cases when a boundary between the first transparent conductive layer 51 and the second transparent conductive layer 52 is clear and cases when this boundary is unclear. There are cases when a boundary between the first transparent conductive layer 51 and the third transparent conductive layer 53 is clear and cases when this boundary is unclear. There are cases when a boundary between the second transparent conductive layer 52 and the third transparent conductive layer 53 is clear and cases when this boundary is unclear.

Thus, different variations of the configuration of the transparent electrode 50 including the first transparent conductive layer 51 and the second transparent conductive layer 52 are possible.

According to the embodiment, a semiconductor light emitting device having excellent electrical characteristics and improved light extraction efficiency and method for manufacturing the same can be provided.

Note that in this specification, the term, "nitride semiconductor" includes semiconductors of all compositions wherein composition ratios of x, y, and z in the formula $B_xIn_yAl_zGa_{1-x-y-z}N$ fall within the respective ranges of $0 \leq x \leq 1$, $0 \leq y \leq 1$, $0 \leq z \leq 1$, and $x+y+z \leq 1$. Furthermore, with the formula described above, "nitride semiconductors" shall also be understood to include semiconductors further including group V elements other than N (nitrogen), semiconductors further including various elements added to control various physical properties such as conductivity type and the like, and semiconductors further including various elements that are included unintentionally.

In this specification, "perpendicular" and "parallel" are not used to mean perpendicular and parallel in their narrowest sense, but rather substantially perpendicular or parallel so as to take factors into account such as variations in manufacturing processes and the like.

An embodiment of the invention with reference to examples was described above. However, the invention is not limited to these examples. The scope of the invention includes all cases in which, for example, a person skilled in the art could make use of publicly known information to appropriately select configuration elements such as the substrate, buffer layer, semiconductor layers, light emitting portion, well layers, barrier layers, intermediate layers, transparent conductive layers, electrodes, and the like included in the semiconductor light emitting device provided that the obtained effects are similar.

Additionally, combinations of elements from two or more of the examples are also included in the scope of the invention, provided they are technically possible and do not depart from the spirit of the invention.

Beside such cases, all semiconductor light emitting devices and manufacturing methods for the same based on the embodiments of the invention described above that are obtainable through appropriate design modifications by a person skilled in the art shall be understood to fall within the scope of the invention, provided such semiconductor light emitting devices and manufacturing methods for the same do not depart from the spirit of the invention.

Furthermore, regarding the scope of the spirit of the invention, it is understood that a variety of variations and modifications could be conceived by a person skilled in the art and that these variations and modifications all fall within the scope of the invention as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor light emitting device, comprising:
   forming a transparent electrode including a lower transparent conductive film and an upper transparent conductive film on a semiconductor layer provided on a light emitting portion, including,
   forming the lower transparent conductive film on the semiconductor layer provided on the light emitting portion by a vapor deposition method, said lower transparent conductive film being formed in an atmosphere free of oxygen and including an inert gas;
   performing a first annealing of the lower transparent conductive film in an atmosphere including oxygen after forming the lower transparent conductive film;
   forming the upper transparent conductive film on the lower transparent conductive film by a vapor deposition method in an atmosphere including oxygen after performing the first annealing; and
   performing a second annealing in a first reduction atmosphere after the forming the upper transparent conductive film, the first reduction atmosphere including at least one of nitrogen and an inert gas, and the first reduction atmosphere not including oxygen.

2. The method according to claim 1, wherein the forming the lower transparent conductive film includes forming the lower transparent conductive film by a sputtering method in an atmosphere including an inert gas, and the forming the upper transparent conductive film includes forming the upper transparent conductive film by a sputtering method in an atmosphere further including an inert gas.

3. The method according to claim 1, further comprising performing a third annealing in a second reduction atmosphere after the performing the first annealing in the atmosphere including oxygen and before the forming the upper transparent conductive film, the second reduction atmosphere includes at least one of nitrogen and an inert gas, and the second reduction atmosphere not including oxygen.

4. The method according to claim 1, wherein the forming the lower transparent conductive film includes forming the lower transparent conductive film by a sputtering method in an atmosphere without oxygen, and the forming the upper transparent conductive film includes forming the upper transparent conductive film by a sputtering method in an atmosphere including oxygen.

5. The method according to claim 1, wherein the lower transparent conductive film is an ITO film, and the upper transparent conductive film is an ITO film.

* * * * *